(12) United States Patent
Logie

(10) Patent No.: US 6,294,809 B1
(45) Date of Patent: Sep. 25, 2001

(54) AVALANCHE PROGRAMMED FLOATING GATE MEMORY CELL STRUCTURE WITH PROGRAM ELEMENT IN POLYSILICON

(75) Inventor: Stewart G. Logie, Campbell, CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

(21) Appl. No.: 09/221,360

(22) Filed: Dec. 28, 1998

(51) Int. Cl.$^7$ ................................................ H01L 29/788
(52) U.S. Cl. ............................................. 257/320; 257/322
(58) Field of Search ................................ 257/316, 319, 257/320, 322

(56) References Cited

U.S. PATENT DOCUMENTS

| | | |
|---|---|---|
| 4,037,242 | 7/1977 | Gosney . |
| 4,503,519 | * 3/1985 | Arakawa ............................. 257/320 |
| 4,752,912 | * 6/1988 | Guterman ............................ 257/320 |
| 4,885,719 | 12/1989 | Brahmbhatt . |
| 4,924,278 | 5/1990 | Logie ................................. 357/23.5 |
| 5,103,425 | 4/1992 | Kuo et al. . |
| 5,366,915 | 11/1994 | Kodama . |
| 5,491,657 | 2/1996 | Haddad et al. ................. 365/185.27 |
| 5,554,552 | 9/1996 | Chi . |
| 5,587,945 | 12/1996 | Lin et al. . |
| 5,615,150 | 3/1997 | Lin et al. . |
| 5,640,346 | 6/1997 | Preslar . |
| 5,646,901 | 7/1997 | Sharpe-Geisler et al. . |
| 5,648,669 | * 7/1997 | Sethi et al. .......................... 257/320 |
| 5,719,427 | 2/1998 | Tong et al. . |
| 5,742,542 | 4/1998 | Lin et al. ........................ 365/185.08 |
| 5,761,116 | 6/1998 | Li et al. . |
| 5,783,457 | 7/1998 | Hsu . |
| 5,912,488 | 6/1999 | Kim et al. . |
| 5,969,992 | 10/1999 | Mehta et al. . |

FOREIGN PATENT DOCUMENTS

| | | |
|---|---|---|
| 0 354 457 | 2/1990 | (EP) . |
| 0 714 133 | 5/1996 | (EP) . |
| 0 776 049 | 5/1997 | (EP) . |
| 0 865 045 | 9/1998 | (EP) . |
| 2 022 922 | 12/1979 | (GB) . |
| 60-053083 | 3/1985 | (JP) . |
| 6-204492 | 7/1994 | (JP) . |
| 10-074850 | 3/1998 | (JP) . |
| 10-223782 | 8/1998 | (JP) . |
| WO 93 18519 | 9/1993 | (WO) . |
| WO 97 02605 | 1/1997 | (WO) . |

OTHER PUBLICATIONS

"Performance Limitations of a Flash EPROM Cell, Programmed with Zener Induced Hot Electrons", by J. Ranaweera, I. Kalastirsky, A. Dibu–Caiole, W.T. Ng, and C.A.T. Salama, Proceedings of the 15th Annual Non–Volatile Semiconductor Memory Workshop, Paper #2.2 (1997).

* cited by examiner

*Primary Examiner*—Gene M. Munson
(74) *Attorney, Agent, or Firm*—Fliesler, Dubb, Meyer & Lovejoy LLP

(57) ABSTRACT

A non-volatile memory cell structure comprises a floating gate, a reverse breakdown injection element at least partially formed in a polysilicon layer and operatively coupled to the floating gate, and a transistor at least partially formed in a region of a semiconductor substrate, operatively coupled to the floating gate. In a further aspect, a control gate is capacitively coupled to the floating gate and is formed in said polysilicon layer. The reverse breakdown electron injection element comprises a first, second, and third active regions, the first and second regions comprising a first p/n junction, the second and third active regions comprising a second p/n junction.

28 Claims, 6 Drawing Sheets

| Operation | ACG | BL | WL | WC | FG |
|---|---|---|---|---|---|
| Erase (bulk) | 0V | 8V | 0V | HiZ | -ve |
| Program | 8V | 8V | 0V | HiZ | -ve+$\Delta V_p$ |
| Not progr. | 0V | 8V | 0V | HiZ | -ve-$\Delta_p$ |
| Not progr. | 8V | 3.3V | 0V | HiZ | -ve |
| Read | 3.3V | ground | 3.3V | 3.3V | -ve(or+$\Delta V_p$) |

$\Delta_p$ = Programming disturb; it should be less than 1V.

$\Delta V_p$ = It will be in 3-8V range depending on programming time. $\Delta V_p \cong 4V$ for $t_{prog} \cong 10 \mu s$.

*Assumed that the junction breakdown voltage is at 7.5V or below so that 8V operation is sufficient for junction breakdown.

*FIG. 4B*
*PRIOR ART*

AVALANCHE PROGRAMMED FLOATING GATE MEMORY CELL STRUCTURE WITH PROGRAM ELEMENT IN POLYSILICON

BACKGROUND OF THE INVENTION

1. Field of the Invention

The invention relates to nonvolatile memory, and particularly a non-volatile memory structure with a program element at least partially formed in a polysilicon layer, optimized for particular applications such as programmable logic devices.

2. Description of the Related Art

Non-volatile memory devices of the type commonly referred to in the art as EPROM, EEPROM, or Flash EEPROM serve a variety of purposes, and are hence provided in a variety of architectures and circuit structures. One such application is termed a "programmable logic device" or PLD. The PLD includes a programmable array of non-volatile memory devices which can be customized by end users for particular applications.

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. EEPROM devices are one such device that must meet these challenges. In some applications, such as flash memory cards, density is at a premium, while in applications such as programmable logic devices (PLD's), speed is more important and space is at less of a premium.

EEPROMS (electrically erasable/programmable read-only memories) generally employ Fowler-Nordheim (F-N) tunneling for both programming and erasing. The term "flash", when used with "EEPROM", generally refers to a device programmed by hot electron injection. Typically, flash technology employs a floating gate structure with a thin oxide layer between the floating gate and the drain side of the transistor where Fowler-Nordheim tunneling occurs.

As process technology moves toward the so-called 0.18 and 0.13 micron processes, the conventional "stacked gate" EEPROM structure has given way to different cell designs and array architectures, all intended to increase density and reliability in the resulting circuit. In addition, designers are driven to reduce the power requirements of such devices as a result of such sealing. In non-volatile memory devices, the program and erase functions generally require the largest voltages and consequently reducing program voltages achieves overall device power savings.

An alternative to the aforementioned FN tunneling-based EEPROM cell structure is presented in Ranaweera, et al., "Performance Limitations of a Flash EEPROM Cell, Programmed With Zener Induced Hot Electrons," University of Toronto Department of Electrical Engineering (1997). Discussed therein is a flash EEPROM cell which accomplishes programming by establishing a reverse breakdown condition at the drain/substrate junction, generating hot electrons which are then swept onto to the floating gate to program the cell.

FIGS. 1A, 1B and 1C of Ranaweera, et al. are reproduced as FIGS. 1A, 1B and 1C of the present application. FIGS. 1B and 1C show cross-sections of the cell shown in FIG. 1A. As shown in FIG. 1C, a "ZEEPROM" cell comprises a source and drain region, floating gate and control gate, with a P+ pocket implant extending part way across the width of the drain region to generate hot electrons for programming. The flash ZEEPROM cells are fabricated using CMOS compatible process technology, with the addition of a heavily doped boron implant for the P+ region replacing the LDD region. A sidewall spacer is necessary to form the self-aligned N+ source and drain regions and to avoid counter-doping of the P+ pocket.

To program the flash ZEEPROM cell, the P+N+ junction is reverse-biased to create an electric field of approximately $10^6$ volt/cm. and generate energetic hot electrons independent of the channel length. The P+ region adjacent to the drain enhances this generation. A low junction breakdown current can be used for programming by optimizing the P+N+ junction depth and controlling the applied drain voltage. One disadvantage of this cell is that a low drain voltage (approximately one volt) must be used to read the cell since the P+ region exhibits a low breakdown voltage which can contribute to "soft programming." Another disadvantage is that the cell provides lower read current compared with conventional flash memory cells since the P+N+ heavy doping required for breakdown reduction allows for very little channel conduction in that portion of the channel. Further, the P+N+ doping increases cell capacitance in the read path and increases switching delays. Erasing in the cell is performed by Fowler-Nordheim tunneling of electrons from the floating gate to the source region using a negative gate voltage and a positive supply voltage connected to the source similar to conventional flash EEPROM cells.

Another alternative cell structure using hot election programming generated by a reverse breakdown condition at the drain is described in the context of a method for bulk charging and discharging of an array of flash EEPROM memory cells in U.S. Pat. No. 5,491,657 issued to Haddad, et al., assigned to the assignee of the present invention. In Haddad, et al., a cell structure similar to that shown in cross-section in FIG. 1B of the present application may be used, as well as a substrate-biased p-well in n-well embodiment. In the first embodiment, an N+ source region includes an N+ implant region and an N diffusion region, and the erase operation (removing electrons) is accomplished by applying (−)8.5 volts to the control gate for 100 milliseconds, and (+)5 volts to the source for 100 milliseconds, with the drain being allowed to float. In contrast, programming (adding electrons to the gate) is achieved by applying a negative 8.5 volt to the substrate for 5 microseconds, zero volts to the drain and control gate with the source floating. The bulk charging operation can just as easily be done on the source side rather than the drain side in a case where the cell is provided in a P well by applying −8.5 volts to the P well for 5 microseconds, 0 volts to the source and control gate with the drain being allowed to float.

Yet another structure and method for programming a cell is detailed in co-pending U.S. patent application Pat. No. 5,978,272, inventors Hao Fang, et al., filed Jul. 24, 1998 and assigned to the assignee of the present application. FIGS. 1A and 1B of the Fang, et al. application are reproduced herein as FIGS. 2A and 2B, and FIGS. 2A and 2B of the Fang application are reproduced as FIGS. 3A and 3B of the present application. The Fang, et al. application uses the programming method disclosed in Haddad, et al. to form a high density, low program/erase voltage and current, and fast byte programming and bulk erase and fast reading speed non-volatile memory structure specifically designed for programmable logic circuit applications.

In Fang, et al. the non-volatile memory cell 10 in FIGS. 2A, 2B is formed of a P substrate 12 having embedded therein an N+ source region 14, an N-type diffused drain region 16, a floating gate 18 capacitively coupled to the P substrate 12 through a tunnel oxide 20, or other gate dielectric such as nitride oxide; and a control gate 22 capacitively coupled to the floating gate 18 through an oxide/nitride/oxide, or other type of inter polysilicon dielectric, film 24,26. Diffused region 16 is formed of a shallowly diffused but heavily doped N-type junction, while source region 14 is formed of a deeply diffused but lightly doped N junction. The relatively thin gate dielectric 20 (an oxide of 60 to 150 Å in thickness) is interposed between top surface of substrate 12 and conductor polysilicon floating gate 18. Control gate 22 is supported above the floating gate by the inter-poly dielectric layer 24,26. Avalanche program and erase bias configurations of the memory cell of the Fang, et al. application are shown in FIGS. 3A and 3B, respectively.

Program and erase operations are illustrated in FIGS. 3A and 3B. To program the cell, electron injection is effected from the drain side. In this case, programming operation is accomplished by applying +3 volts on the drain and –6 volts on the P substrate so as to shift upwardly the threshold voltage $V_t$ by 4 volts in approximately 0.002 seconds. To erase, holes are injected from the drain side by applying +6.5 volts on the drain and –3 volts on the P substrate so as to shift down with the voltage threshold $V_t$ by 4 volts. Utilizing the substrate bias configuration suppresses hot hole injection due to the fact that the location of the high field is away from the oxide interface, the magnitude of the maximum field strength is reduced by more than 50%, and the vertical field does not favor hole injection.

FIGS. 4A and 4B show FIGS. 10A and 10B of the Fang, et al. application which teach a single polysilicon layer embodiment of the Fang, et al. cell. In such an embodiment, the control gate is replaced with a diffusion region. The control gate can be switched between 0 volts and $V_{cc}$ to select and de-select the cell during the read period and between $V_{jb}$ and 0 volts to program and erase the cells as set forth above. A select transistor is added at the source side to enable a fast read of the memory cell. In this operation, the gate of the added select transistor is set at less than or equal to zero volts during program and erasing and at $V_{cc}$ with $V_d$ less than or equal to $V_{cc}$ and $V_{dm}=0$ volts via turning on the memory cell for the read period. ($V_d$ is the drain voltage for the select transistor and $V_{dm}$ is the drain voltage for the memory transistor.) Cell size is decreased in comparison to conventional single poly memory cells for programmable logic devices. The bias configurations for the single poly memory cell are disclosed in FIG. 4B.

Generally, arrays of such individual memory cells are formed on a single substrate and combined with sense and read circuitry, and connected by row-wise and column-wise conductive regions or metallic conductors to allow for array wide bulk program and erase as well as selected bit programming.

In the aforementioned prior art references, each of the devices is provided as an NMOS transistor in a P-doped substrate. The only exception is the Haddad et al reference wherein an NMOS transistor is formed in a p-well which itself is formed in an n-well in a p-type substrate.

Each of the aforementioned configurations presents advantages and disadvantages in use in particular applications. Nevertheless, improvements in both the structure of individual cells and the manner in which they are connected together will result in more reliable, stable, faster, and lower power devices which can be programmed and erased at lower voltages.

Alternative cell constructions, saving space and increasing device efficiency, are generally desired.

SUMMARY OF THE INVENTION

The invention, roughly described, comprises a non-volatile memory cell structure. In one aspect, the structure comprises a floating gate, an injection element at least partially formed in a polysilicon layer and positioned over the floating gate, and a transistor at least partially formed in a region of a semiconductor substrate and capacitively coupled to the floating gate. In a further aspect, a control gate is capacitively coupled to the floating gate and is formed in said polysilicon layer.

The injection element comprises a first, second, and third active regions, the first and second regions comprising a first p/n junction, the second and third active regions comprising a second p/n junction.

In a unique feature of the invention, the polysilicon layer comprises a second polysilicon layer, said injection element is formed in said second polysilicon layer, and the floating gate is formed in a first polysilicon layer.

In yet another feature of the first polysilicon layer overlies a portion the silicon substrate and a portion of a device isolation region in the silicon substrate.

In one embodiment, the transistor comprises a sense transistor which includes a fourth and fifth active regions formed in said substrate and separated by a channel region. The device may include a read transistor having a sixth active region and sharing said fifth active region with said sense transistor.

BRIEF DESCRIPTION OF THE DRAWINGS

The invention will be described with respect to the particular embodiments thereof. Other objects, features, and advantages of the invention will become apparent with reference to the specification and drawings in which:

FIG. 4B is a table showing the voltages utilized in accordance with the single poly memory cell shown in FIG. 4A.

DETAILED DESCRIPTION

In one aspect, the invention comprises a novel EEPROM cell structure incorporating avalanche/Zener based reversed breakdown generation of hot electrons or hot holes in an injection element for program or erase a floating gate. The cell provides advantages in size and reliability of an EEPROM array by placing at least one of the injector elements in a polysilicon layer which, in one embodiment, can be formed over a device isolation regions.

In the following description, numerous details, for example specific materials process steps, etc., are set forth in order to provide a thorough understanding of the invention. It will be readily understood, however, to one of average skill in the art that specific details need not be employed to practice the present invention. Moreover, specific details of particular processes or structures may not be specifically presented in order to not unduly obscure the invention where such details would be readily apparent to one of average skill in the art. Those having ordinary skill in the art and access to the teachings described herein will recognize additional modifications and applications and embodiments within the scope of the present invention.

As discussed herein, non-volatile memory cells are typically utilized with accompanying circuitry in cell structures. Such circuitry includes means for controlling voltages applied to the respective terminals of the floating gate device, and for reading the state of the device after it is programmed. It will be recognized that the manner in which the cell of the present invention is so connected may vary in accordance with any number of known schemes, and may include those manners of operation disclosed in co-pending U.S. patent application Ser. No. 09/220,201 entitled FLOATING GATE MEMORY APPARATUS AND METHOD FOR SELECTED PROGRAMMING THEREOF, Inventors Stewart G. Logie, Sunil D. Mehta, and Steven J. Fong, filed Dec. 23, 1998, incorporated fully herein by reference.

Figure 5:
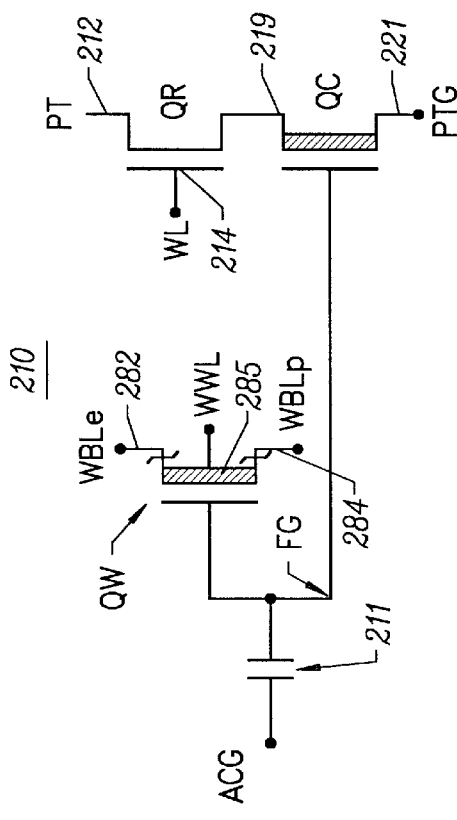
FIG. 5 is a schematic diagram of a memory cell formed in accordance with the invention.
Figure 7:
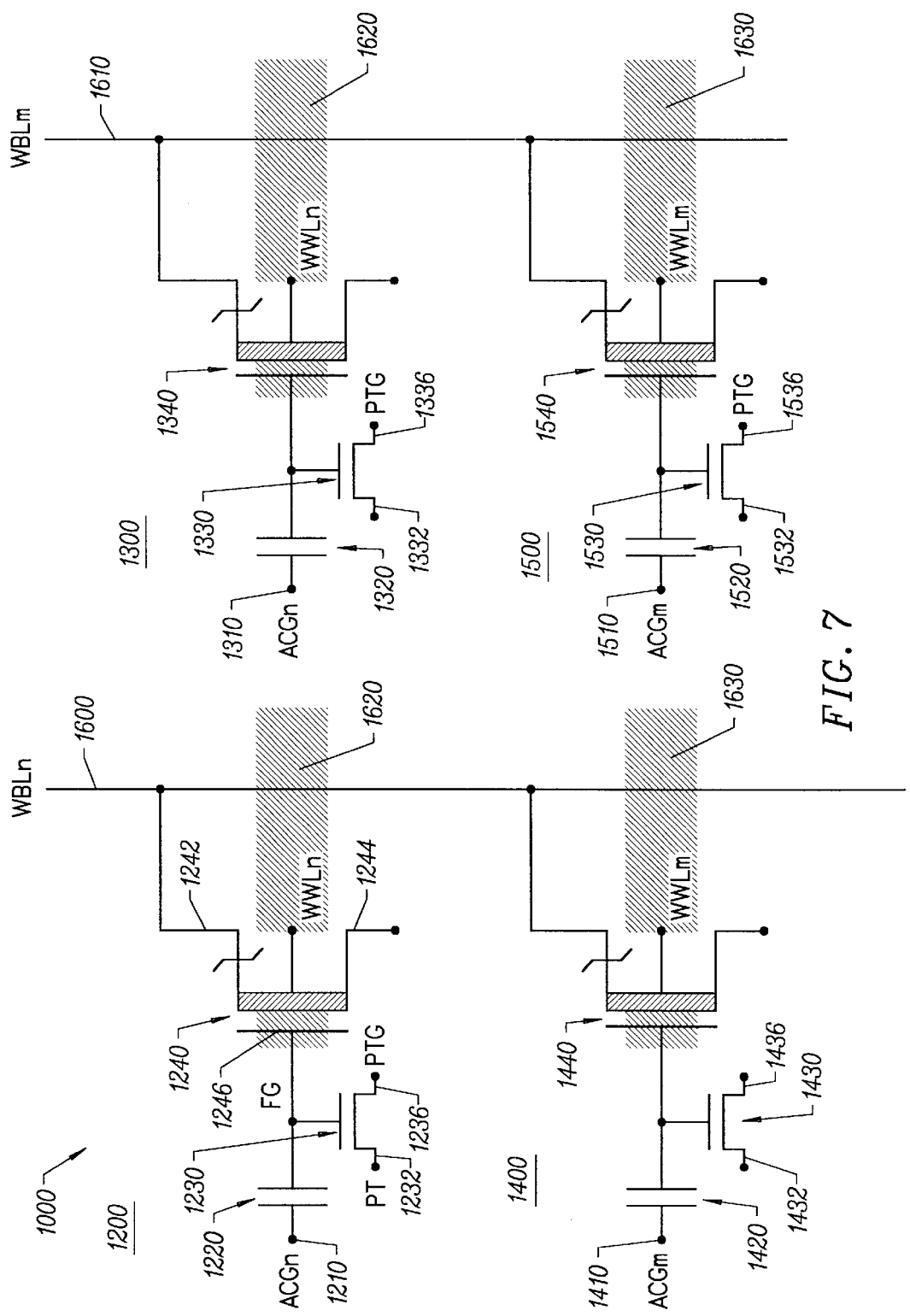
FIG. 7 shows a two-by-two matrix of non-volatile memory cells in accordance with the present invention.

FIG. 5 shows a schematic diagram of a first embodiment of a nonvolatile memory cell structure 210 formed in accordance with one aspect of the present invention.

Cell 210 includes an (array) control gate ACG, floating gate FG, avalanche/Zener program element $Q_w$, a read transistor $Q_r$, and a sense transistor $Q_c$. The control gate ACG is used to accelerate electrons or holes selectively to or from the floating gate by capacitively coupling a field across the dielectric that separates the injection element from the floating gate. Sense transistor $Q_c$ and injection element $Q_w$ share respective portions of floating gate FG. Floating gate FG is capacitively connected to array control gate (ACG) voltage via capacitor oxide 211.

Sense transistor $Q_c$ shares its drain 219 with the source of read transistor $Q_r$. Gate 214 of read transistor $Q_r$ is coupled to word line WL. The drain 212 of read transistor $Q_r$ is connected to a read signal select (product term) PT, while the source 221 of sense transistor $Q_c$ is connected to sense signal (product term ground) PTG.

Figure 1A:
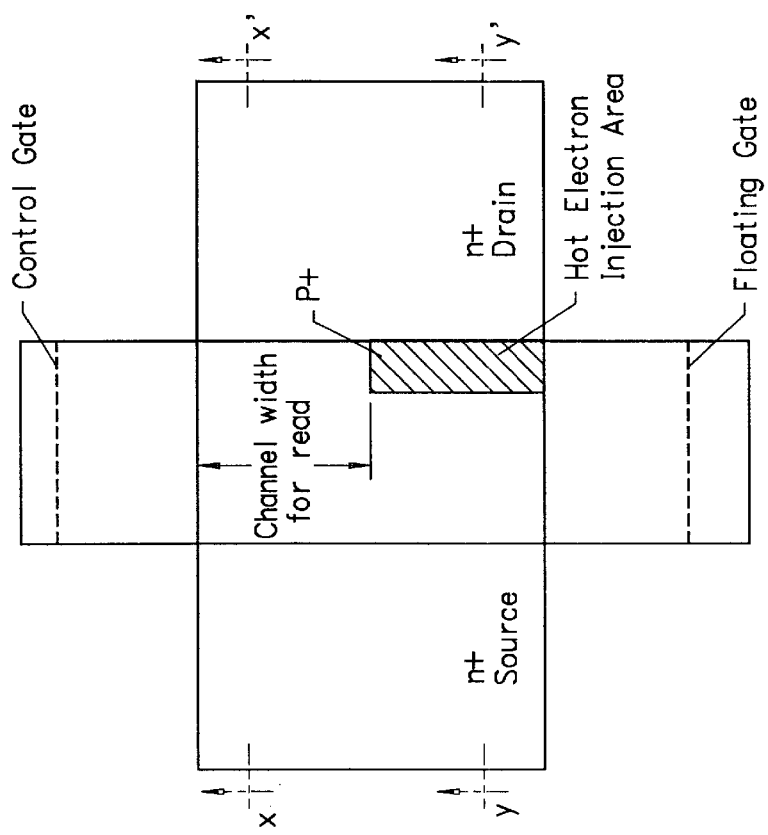
FIG. 1A is a plan view of a Zener breakdown based flash EEPROM cell.
Figure 1B:
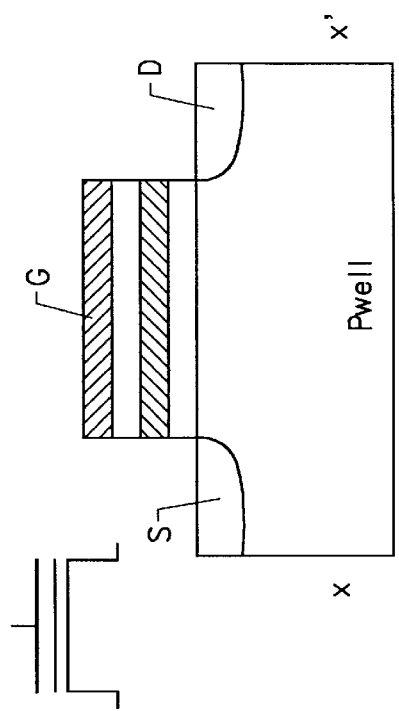
FIGS. 1B and 1C are cross-sections of a prior art reverse breakdown cell, and the Zener breakdown cell shown in FIG. 1A, respectively.
Figure 1C:
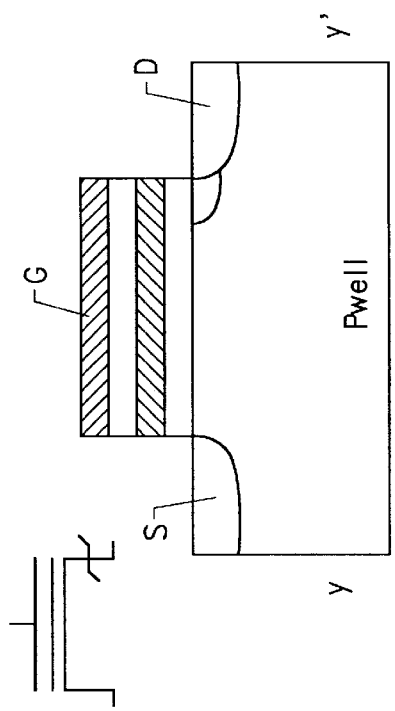
Figure 2A:
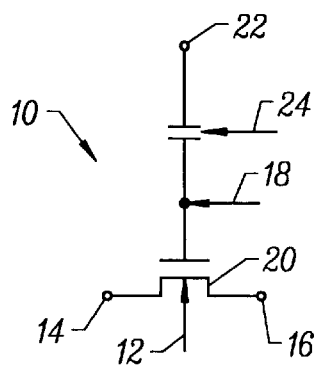
FIG. 2A is a schematic diagram of the non-volatile memory cell of the prior art.
Figure 2B:
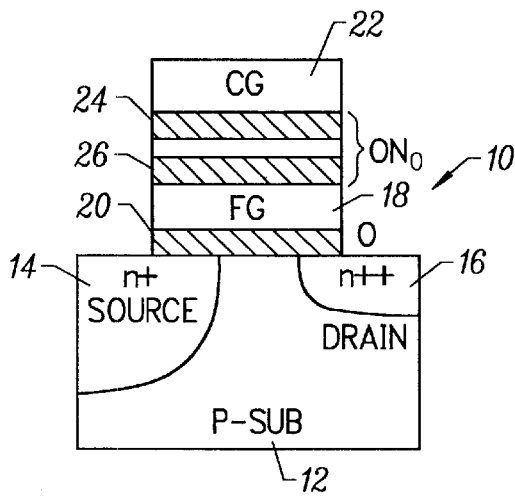
FIG. 2B shows a cross-sectional view of a non-volatile memory cell in accordance with the prior art.
Figure 3A:
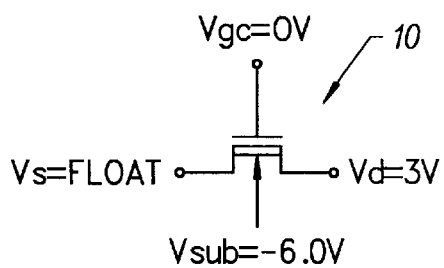
FIGS. 3A and 3B, respectively, show avalanche program and erase bias configurations of a memory cell in accordance with the prior art.
Figure 3B:
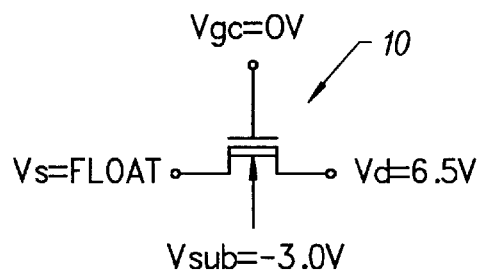
Figure 4A:
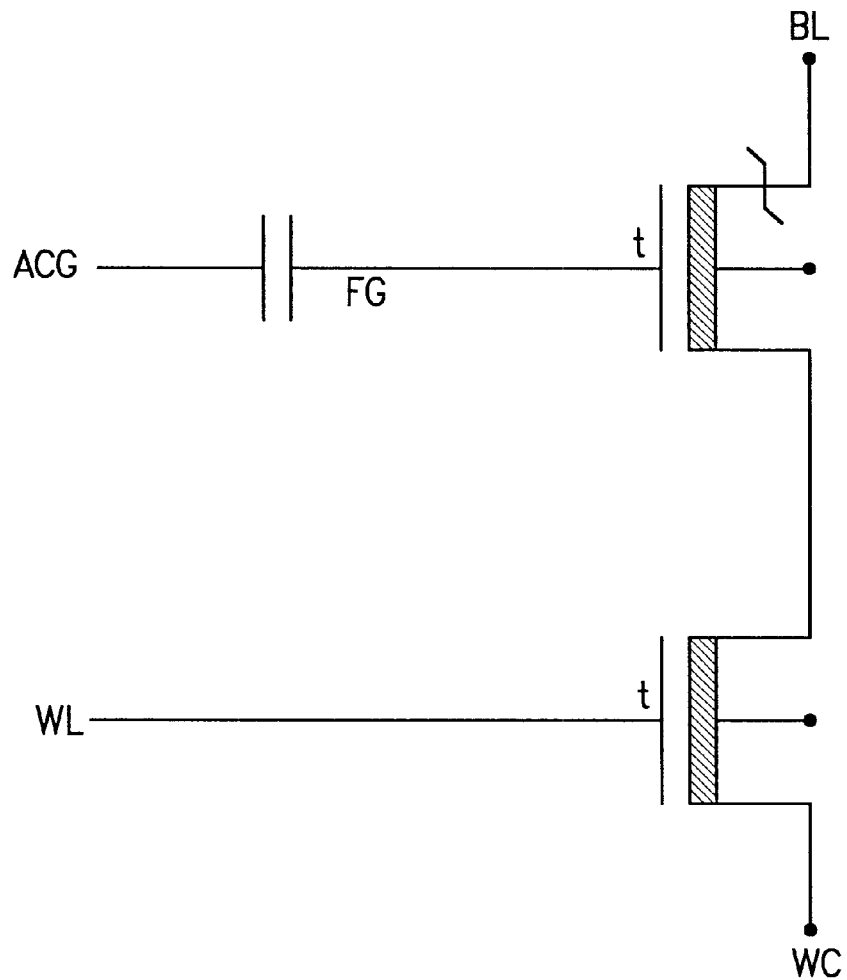
FIG. 4A is a schematic diagram of a single poly memory cell in accordance with the prior art.
Figure 6:
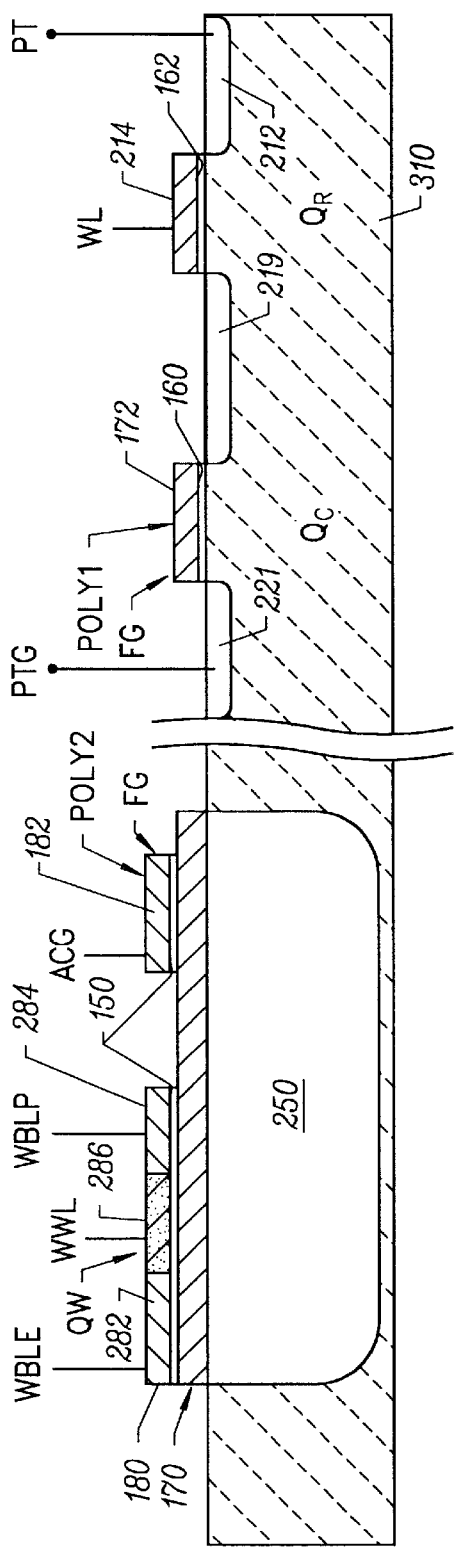
FIG. 6 is a partial semiconductor cross-section of a memory cell formed in accordance with the present invention.

FIG. 6 is a cross-section of a first embodiment of the EEPROM cell structure of FIG. 5. The cell of the present invention is constructed on and in a silicon substrate 310, which has a background doping concentration of a first conductivity type, such as a P-type conductivity. In one embodiment, floating gate FG is formed in a first polysilicon layer POLY 1 over the substrate 310. In this embodiment, region 170 and the portion of first polysilicon layer POLY 1 over which $Q_w$ is formed rests on a device isolation region 250. Injector element $Q_w$ is formed in a portion 180 of a second layer of polysilicon (POLY 2) over part of floating gate FG and is electrically separated from the floating gate FG by a second dielectric 150, e.g. silicon dioxide. A portion 172 of floating gate FG overlies the channel 280 of sense transistor $Q_c$. An array control gate (ACG) is also formed in a second portion 182 of the POLY 2 layer, and rests over a second part of the floating gate. Regions 182 of layer POLY 2 in which the program element $Q_w$ is formed is separated from the first portion 180.

As shown in FIG. 6, element $Q_w$ comprises an N+ region 282, a P+ region 286, and a second N+ region 284, all formed in portion 180 of second poly layer POLY 2. Dielectric 150 separates second poly layer 180 from first poly layer 170 is, in one embodiment, an oxide being approximately 300 angstroms thick. The device isolation region 250 may comprise silicon dioxide having a thickness of about 1000–8000 angstroms, also formed on substrate 310. Region 250 is formed in semiconductor substrate 310 by any number of well-known techniques such as, for example, local oxidation of the silicon (LOCOS), shallow trench isolation, or the like. It should be recognized that the particular type of device isolation utilized in the present invention is not limiting on the scope or nature of the present invention, and various types of such device isolation may be utilized without departing from the scope of the invention discussed herein.

Sense transistor $Q_c$ has a source 221 and a drain 219 formed in the semiconductor substrate 310. A sense channel 280 is formed between source 221 and drain 219. The conductivity of the source 221 and the drain 219 is of the second conductivity type, for example, an N+ conductivity type. Overlying the channel 280 is a first oxide layer 160 having an approximate thickness of 80 angstroms. Oxide layer 160 may be formed by thermal oxidation of silicon in accordance with well-known techniques. Depending on the mode of sense transistor $Q_c$ (depletion or enhancement mode), the relevant voltages for operating the EEPROM cell 210 are adjusted. The sense transistor $Q_c$ is, in one embodiment, a depletion mode transistor, as is commonly understood in the industry. In a further embodiment, the sense transistor $Q_c$ is an enhancement mode transistor (also as commonly known in the industry).

The read transistor $Q_r$ shares diffusion region 219 with the sense transistor $Q_c$. Hence region 219 acts as the read transistor source. The read transistor $Q_r$ also has a drain 212 that has the second conductivity type, e.g. an N+ conductivity type. A channel 285 is positioned between source 219 and drain 212. Overlying the read channel is an oxide layer 162 that is composed of an insulating material, such a silicon dioxide, and has an approximate thickness of 35–80 angstroms. Read oxide 162 may be formed simultaneously with oxide 160 (and may comprise an etched portion of oxide 160), or may be formed separately therefrom with appropriate masking and growth steps. A read gate 214 overlies the read oxide layer 162 and is composed of a conducting material, such as a polycrystalline silicon material.

Element $Q_w$ may be formed by one or more P/N junction regions (282/286, 284/286). The POLY 1 layer may be deposited and etched to provide the respective portions (170, 172, 214) overlying areas of the substrate to where the read and sense transistors are to be later formed. The doping of regions 212, 219, and 221 occurs after formation of floating gate FG so regions 212, 219, and 221 are self-aligned. Implants for transistors $Q_c$ and $Q_r$ can be performed in accordance with well-known implanting techniques. Regions 212, 219 and 221 can be N+ regions having a surface doping concentration of approximately $10^{20}$ cm$^{-3}$. Second oxide layer 150 can thereafter comprise a thermal or deposited oxide formed on the surface of first poly layer POLY1.

Subsequently, POLY 2 may be deposited with an initial P-type bias and then counter doped with an N-type impurity in appropriate portions of POLY 2 (e.g. regions 282,284) with appropriate masking of the POLY 2 layer to form the P/N junctions. POLY 2 may also be deposited with an initial N doping and P+ counter doped. Appropriate etching will form portion 181 of polysilicon layer 180 and portion 182 of polysilicon layer 180 which serves as the array control gate ACG.

The transistors $Q_w$, $Q_c$ and $Q_r$ of EEPROM 210 are electrically connected to certain electrical lines and gates in order to operate and control the functions of the EEPROM cell 210. As shown in FIG. 5, $WBL_e$ is electrically connected to region 282, $WBL_p$ connected to region 284, and WWL to P+ region 286. An array control gate (ACG) is electrically connected to the floating gate FG. A product term ground (PTG) is electrically connected to the sense source 221 of the sense transistor $Q_c$. A word line read (WL) is electrically connected to the read gate 214 of the read transistor $Q_r$ and a product term (PT) is electrically connected to the read drain 212.

Typical operating voltages for the foregoing lines to erase, program and read the cell are given in Table 1 for the case of an N++/P write element (i.e., inject electrons onto the floating gate FG during erase, and inject holes onto the floating gate FG during program):

TABLE 1

|  | $WBL_c$ | $WBL_p$ | ACG | WWL | WL | PT | PTG |
|---|---|---|---|---|---|---|---|
| Program | 0v | 6v | 0v | 0 | 0v | Float | 0v |
| Erase | 6v | 0v | 8v | 0 | $V_{cc}$ | Float | 8v |
| Read | 0v | 0v | 0v | 0 | $V_{cc}$ | $V_{cc}$ | 0v |

According to the present invention, hot carriers generated by Avalanche/Zener breakdown are employed to program and erase memory cell 200. The $P^+N^+$ junction formed by regions 284,286 is reverse biased as set forth in Table 1 when the voltage difference between WBL and WWL exceeds the breakdown voltage. Both hot electrons and hot holes are generated during breakdown. Hot electrons are accelerated toward the floating gate FG when the potential in the floating gate FG capacitively coupled from the ACG becomes greater than that of region 286. At a large enough field across oxide layer 150 hot electrons generated at the junction in breakdown are "injected" into floating gate FG through oxide layer 150 and the resulting net negative voltage on floating gate FG erases memory cell 200.

Reverse biasing the $P^+N^+$ junction formed by $P^+$ region 286 and either $N^+$ region 282 or 284 allows programming when a low or zero voltage on ACG with $P^+N^+$ junction 282/286 or 284/286 in Avalanche/Zener breakdown mode injects hot holes through a portion of oxide layer 150. The resulting net positive voltage on floating gate FG programs memory cell 200.

The cell of the present invention hence promotes a number of advantages over the prior art that lead to a reduced size. The array control gate (ACG) and program element can be formed over device isolation.

In addition, precise control of the reverse breakdown potential of the write element is possible through the present invention. The self aligned $P^+/N^+$ junction provides repeatable control of the junction location. Further, doping of the lighter doped side (POLY 2) of the avalanche/Zener element is independent of the doping requirements of the transistor.

Still further, reliability of the device of the present invention is improved. The doping of the polysilicon layer POLY 2 is independently controlled, allowing optimization of oxide growth. Program and erase functions can be performed through different portions of oxide 150, leading to a reduction in the potential for formation of carrier traps and allowing independent optimization of each of the P+N+ avalanche/Zener elements $WBL_c$ and $WBL_p$.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A non-volatile memory cell structure, comprising:
    a floating gate;
    a reverse breakdown injection element at least partially formed in a poly-silicon layer and operatively coupled to the floating gate; and
    a transistor at least partially formed in a region of a semiconductor substrate, operatively coupled to the floating gate.

2. The structure as defined in claim 1 further comprising:
    a control gate capacitively coupled to the floating gate.

3. The structure as defined in claim 2 wherein the control gate is formed in said polysilicon layer.

4. The structure as defined in claim 1 wherein said polysilicon layer comprises a second polysilicon layer, said reverse breakdown injection element is formed in said second polysilicon layer, and said floating gate is formed in a first polysilicon layer.

5. The structure as defined in claim 4 wherein the first polysilicon layer overlies a portion of the silicon substrate and a portion of a device isolation region in the silicon substrate.

6. The structure as defined in claim 4 wherein the first poly layer is separated from the substrate by a first oxide layer and the second poly layer is separated from the first poly layer by a second oxide layer.

7. The structure as defined in claim 6 wherein the first oxide has a thickness of about 70 to 90 Å.

8. The structure as defined in claim 6 wherein the second oxide has a thickness of about 250 to 350 Å.

9. The structure as defined in claim 1 wherein the reverse breakdown electron injection element comprises a first, second, and third active regions, the first and second regions comprising a first p/n junction, the second and third active regions comprising a second p/n junction.

10. The structure as defined in claim 9 wherein said polysilicon layer comprises a second polysilicon layer and the first, second, and third active regions are provided in said second polysilicon layer, and the floating gate is provided in a first polysilicon layer.

11. The structure as defined in claim 10 wherein the second polysilicon layer overlies at least a portion of the first silicon layer.

12. The structure as defined in claim 11 wherein a first portion of said first and second polysilicon layers partially overlies a device isolation region in the substrate.

13. The structure as defined in claim 12 further comprising a control gate, operatively coupled to the floating gate.

14. The structure as defined in claim 13 wherein the control gate is provided in a second portion of said second polysilicon layer.

15. The structure as defined in claim 14 wherein the transistor comprises a sense transistor which includes a fourth and fifth active regions formed in said substrate and separated by a channel region.

16. The structure as defined in claim 15 further including a read transistor having a sixth active region and sharing said fifth active region with said sense transistor.

17. A non-volatile memory cell structure, comprising:
a semiconductor substrate having a surface and a doping concentration of a first conductivity type;
a first oxide layer on the surface of the substrate;
a floating gate constructed in a first polysilicon layer on a first portion of the first oxide layer and overlying a first portion of the surface of the substrate;
a second oxide layer on the floating gate;
a control gate formed in a first portion of a second polysilicon layer operatively coupled to a first portion of the floating gate;
an injection element including a p/n junction formed in a second portion of the second polysilicon layer; and
a sense transistor including a first source region, and a first drain region both formed in the substrate, and a portion of the floating gate separated from the first source region and the first drain region by a second portion of said first oxide layer.

18. The structure of claim 17, further comprising
a read transistor having a second drain region and sharing said first source region, a second portion of said first oxide, and a control gate overlying the second portion of the first oxide.

19. The structure as defined in claim 17 wherein the first oxide has a thickness of about 70 to 90 Å.

20. The structure as defined in claim 17 wherein the second oxide has a thickness of about 250 to 350 Å.

21. The structure as defined in claim 17 wherein the first source region and said first drain are heavily doped impurity regions.

22. An EEPROM structure, comprising:
a semiconductor substrate of a first conductivity type having a surface;
a sense transistor including a first source and drain regions formed in the substrate adjacent to the surface of said substrate;
a floating gate positioned adjacent to the surface of the substrate and separated from said surface by a gate oxide layer, the floating gate having a first portion overlying the first transistor and at least a second portion overlying a device isolation region;
an injection element in a polysilicon layer overlying the floating gate and separated from it by an oxide layer;
wherein the injection element is constructed so that a reverse voltage breakdown condition generated in the element adds or removes electrons from the floating gate when an appropriate voltage is applied to the floating gate.

23. The structure of claim 22 further including a control gate capacitively coupled to the floating gate and coupled to a control gate voltage.

24. The structure of claim 22 wherein the injection element includes at least a first and a second active regions forming a first PN junction, and the first active region is coupled to a write control voltage and the second active region is coupled to a device control voltage.

25. The structure of claim 24 wherein the injection element includes a third active region forming a PN junction with the second active region and the third active region is coupled to an erase control voltage.

26. A memory array comprising a plurality of memory cells on a semiconductor substrate, comprising:
a plurality array control gate voltage conductors;
a plurality of write bit line conductors;
a plurality of product term gates;
a plurality of word lines;
a plurality of product terms;
an array of memory cells, each cell comprising:
a floating gate formed in a first polysilicon layer coupled to one of said array control gate conductors;
an array control gate formed in a second polysilicon layer overlying the first polysilicon layer and coupled to one of the plurality of array control gate voltage conductors;
a reverse breakdown electron injection element at least partially formed in said second polysilicon layer and operatively coupled to the floating gate, having a first active region coupled to one of said plurality or write bit line conductors and a second active region coupled to one of said plurality of write word lines, the regions forming a PN junction;
a sense transistor comprising a source, drain and channel regions formed in the substrate, and underlying a portion of the floating gate; and
a read transistor at least partially formed in the semiconductor substrate sharing said source of said sense transistor as a drain region and having a source region, and including a control gate coupled to one of said word line conductors.

27. The memory array of claim 26 wherein the substrate includes a plurality of device isolation regions formed therein, and wherein said reverse breakdown electron injection element of one of said array of memory cells is formed over at least a portion of one of said plurality of device isolation regions.

28. The memory array of claim 27 wherein at least one of said array control gates of one of said array of memory cells is formed over said portion of one of said plurality of device isolation regions.

* * * * *